United States Patent [19]
Krick

[11] Patent Number: 6,009,504
[45] Date of Patent: Dec. 28, 1999

[54] APPARATUS AND METHOD FOR STORING DATA ASSOCIATED WITH MULTIPLE ADDRESSES IN A STORAGE ELEMENT USING A BASE ADDRESS AND A MASK

[75] Inventor: Robert F. Krick, Beaverton, Oreg.

[73] Assignee: Intel Corporation, Santa Clara, Calif.

[21] Appl. No.: 08/726,047

[22] Filed: Sep. 27, 1996

[51] Int. Cl.$^6$ .............................. G06F 12/00; G11C 15/00
[52] U.S. Cl. ................................ 711/220; 711/108; 711/3
[58] Field of Search ....................................... 711/108, 118, 711/3, 209, 210, 211, 217, 220; 365/49

[56] References Cited

U.S. PATENT DOCUMENTS

| | | | |
|---|---|---|---|
| 4,296,475 | 10/1981 | Nederlof et al. | 711/108 |
| 4,580,240 | 4/1986 | Watanabe | 365/49 |
| 4,670,858 | 6/1987 | Alkmy | 365/49 |
| 5,319,763 | 6/1994 | Ho et al. | 711/108 |
| 5,430,683 | 7/1995 | Hardin et al. | 365/227 |

*Primary Examiner*—Glenn Gossage
*Attorney, Agent, or Firm*—Blakely, Sokoloff, Taylor & Zafman LLP

[57] ABSTRACT

A method and apparatus for storing and retrieving data associated with multiple addresses in a storage element of a storage device having a number of storage elements, a first memory having a like number of base locations, a second memory having a like number of mask locations, and control logic coupled to the storage device, the first memory, and the second memory. To store data, the control logic receives a first data entry and a first data address. The first data entry is stored in a storage element of the storage device. The first data address is stored as a base address in the first memory at a first location associated with the storage element. A mask is cleared in the second memory at a second location associated with the storage element. The control logic receives a second data entry and a second data address. The second data entry is stored in the storage element. The mask in the second memory at the second location is set to indicate bits that are not equal in the base address and the second data address. To retrieve data, the control logic receives a data address. The data address is compared to a base address stored at a first location in the first memory using a mask stored at a second location in the second memory, said second location being associated with the first location. Retrieval of data stored in a storage element of the storage device associated with the first location is aborted if the unmasked portion of the data address does not equal the unmasked portion of the base address. The control logic determines if the data address is equal to an actual address of data stored in the storage element and, if so, retrieves data stored in the storage element.

20 Claims, 8 Drawing Sheets

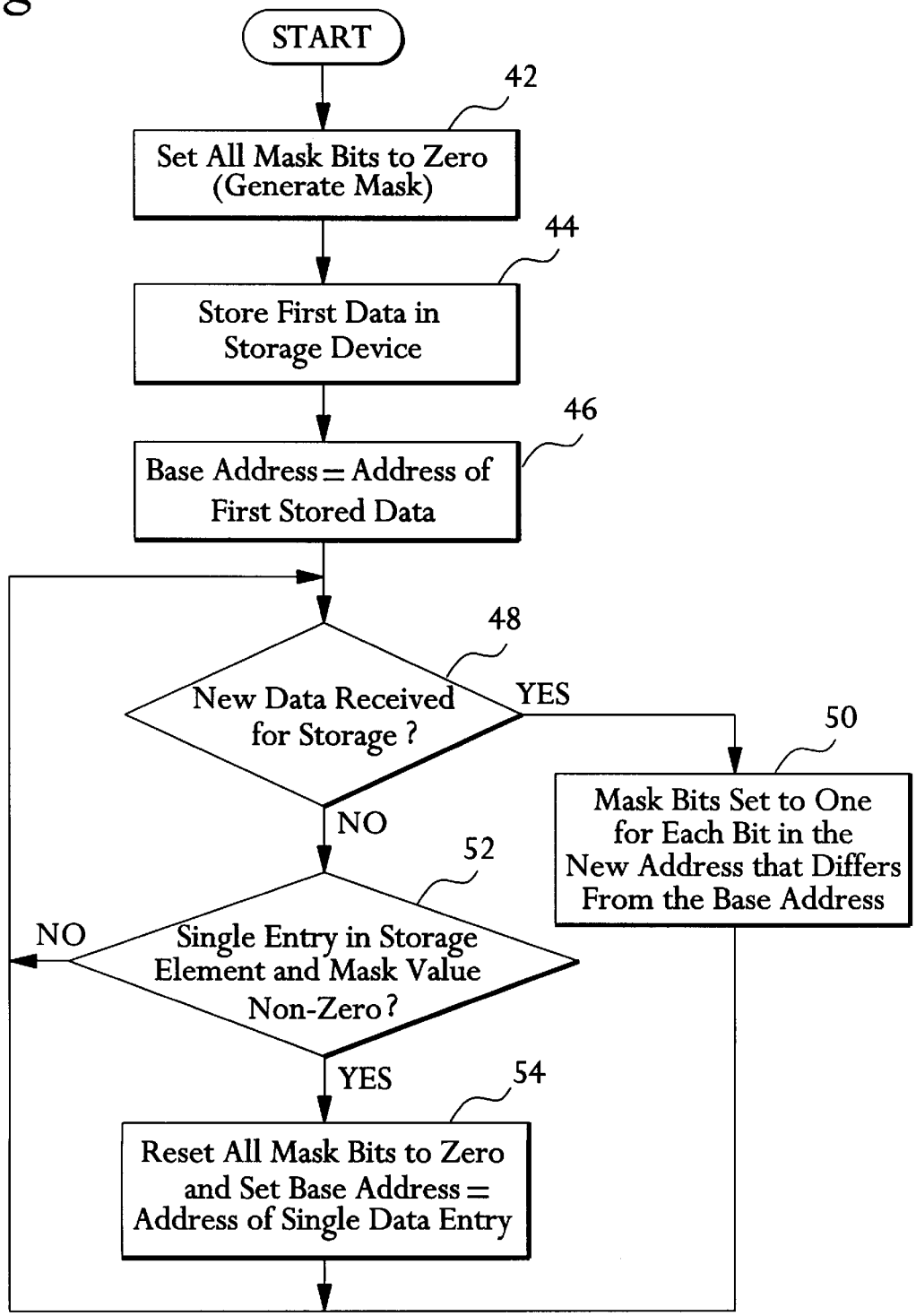

APPARATUS AND METHOD FOR STORING DATA ASSOCIATED WITH MULTIPLE ADDRESSES IN A STORAGE ELEMENT USING A BASE ADDRESS AND A MASK

BACKGROUND OF THE INVENTION

1. Field of the Invention

The present invention relates to systems for storing and accessing data. In particular, the invention provides a system for storing data associated with multiple addresses in a storage element.

2. Background

Buffers, caches, and other high-speed memory devices may be used in processor-based systems to improve overall system performance. In particular, data access speed is increased by constructing buffers and caches using high-speed memories. A buffer or cache provides a temporary storage location for data or instructions that are expected to be required by the processor in the near future. Caches and buffers are often manufactured from fast memories such as static random-access memory (SRAM) to provide faster access than a typical dynamic random-access memory (DRAM). Thus, the processor can access data stored in an SRAM-based cache or buffer faster than accessing the same data from a DRAM.

Various known computer systems include a tag SRAM array that functions as a look-up table for addresses stored in the array. The look-up table addresses correspond to each separate data address in the cache. Each address is stored in a separate entry in the SRAM array, referred to as a tag. Thus, the tag array is capable of identifying the data currently stored in the cache memory.

As data is stored in the cache or buffer, the main memory address is stored in the tag array. When a memory request is received from a processor or other device, the requested address is compared with the entries in the tag SRAM. If the requested address matches an address stored in the tag SRAM, then the data is retrieved from the cache or buffer. If the requested address does not match any entry in the tag SRAM, then the data is retrieved from main memory.

Caches and buffers may be arranged such that multiple data entries are stored in a single cache line or buffer line. In this situation, a separate address must be provided for each entry. Typically, a high-speed memory device is used to store these addresses. The use of multiple address tags requires additional memory storage space for the multiple address tags. However, the additional tag storage space is under utilized when a single data entry is stored in the cache line. This approach represents an inefficient use of the high-speed memory used to store address tags.

Alternatively, a particular cache line or buffer may be restricted to storing a single data entry, thereby requiring storage space for a single address tag. However, this may result in a partially empty cache line or buffer if the size of the stored data is smaller than the cache line capacity. This under utilization of the high-speed SRAM cells represents an inefficient use of memory resources.

Therefore, it is desirable to provide a system for storing data associated with multiple addresses in a storage element without requiring a significant increase in the size of the memory required to match the address tags.

SUMMARY OF THE INVENTION

The present invention provides a system for storing data associated with multiple addresses in a storage element. Storage elements may include cache lines, buffer lines, buffers, or similar storage devices. The system utilizes a base address associated with each storage element and a mask value associated with the base address. The addition of new data in a storage element causes modification of the mask value such that the address of the new data may be identified. Thus, the invention permits multiple addresses to be associated with a storage element without significantly increasing the size of the memory required to match the addresses.

An embodiment of the present invention utilizes a base address associated with the storage element. The base address represents the address of a single data entry in the storage element. A mask associated with the base address is modified in response to the addition of a subsequent data entry to the storage element.

A particular aspect of the invention modifies the mask by comparing the base address and an address associated with the subsequent data entry to the storage element.

One embodiment of the invention uses a content-addressable memory to store the base address.

Another feature of the invention controls the storage of additional data in a particular storage element based on the base address and the mask associated with the base address.

Another embodiment of the invention provides multiple base addresses associated with the storage element. In this embodiment, a separate mask is associated with each base address.

In a specific embodiment of the invention, the storage device is a cache memory and the storage element is one or more cache lines within the cache memory.

In another embodiment of the invention, the storage device is a buffer and the storage element is one or more buffer lines within the buffer.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

FIG. 7 is a flow diagram illustrating an embodiment of a procedure used to generate and update mask values associated with each content-addressable memory row.

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, and circuits have not been described in detail so as not to obscure the invention.

The present invention provides a system for storing data associated with multiple addresses in a storage element. Storage elements may include one or more cache lines, one or more buffer lines, buffers, queues, or similar storage devices. Storage elements may be a portion of a larger storage device (e.g., a cache line in a cache) or an entire storage device (e.g., a buffer or queue). The invention uses a base address associated with the storage element and a mask value associated with the base address. The addition of new data in the storage element causes modification of the mask value such that the address of the new data may be identified. Thus, the invention permits a particular storage element to contain data associated with multiple addresses without significantly increasing the memory required to match the multiple addresses.

A particular embodiment of the invention will be described as contained in a cache memory of a computer system. However, those skilled in the art will appreciate that the present invention may be used with any type of storage device, including a cache, buffer, or other storage device used in any type of system. Furthermore, the invention may be incorporated within a processor or may be contained in one or more devices external to a processor.

Figure 1:
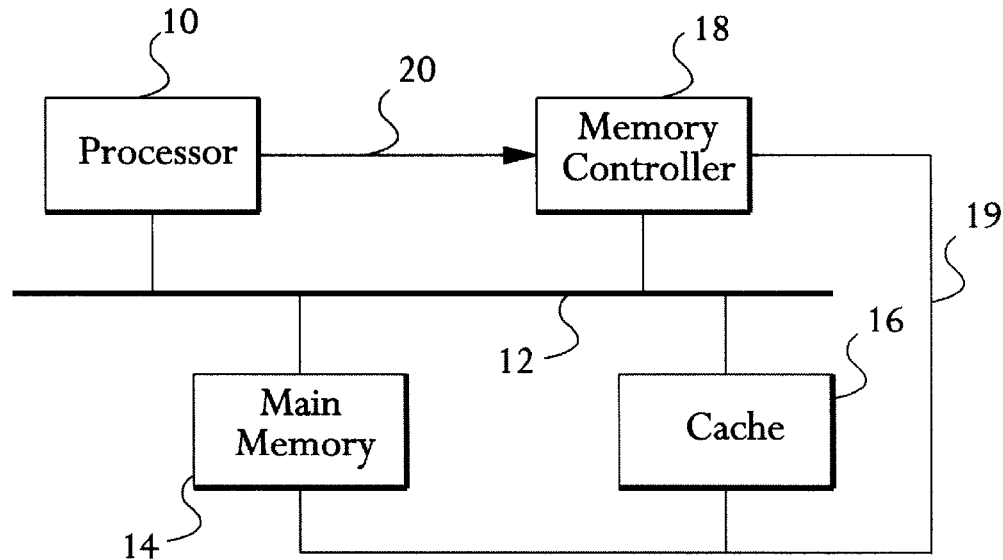
FIG. 1 illustrates an embodiment of a computer system capable of implementing the teachings of the present invention.

FIG. 1 illustrates an embodiment of a computer system capable of implementing the teachings of the present invention. A processor 10 is coupled to a bus 12 for communicating with other system components. A main memory 14 and a cache 16 are also coupled to bus 12. Main memory 14 may be constructed using dynamic random-access memories (DRAMs) or similar memory devices. Cache 16 may be constructed from static random-access memories (SRAMs) or similar high-speed memory devices. A memory controller 18 is coupled to bus 12 and coupled to processor 10 using a communication medium 20. Memory controller 18 controls the accessing and storage of data in main memory 14 and cache 16. Memory controller 18 uses a communication medium 19 for transmitting control signals and related information to main memory 14 and cache 16. FIG. 1 illustrates one embodiment of a processor-based system capable of implementing the present invention. Those skilled in the art will appreciate that various computer systems and system configurations may be used to practice the invention.

During a typical read operation, processor 10 generates a request to retrieve data from a particular memory storage location or address. Processor 10 communicates this request to memory controller 18 using communication medium 20. Memory controller 18 generates an appropriate signal to retrieve the data from cache 16 or main memory 14 after determining whether the requested data is stored in cache 16. If the requested data is stored in cache 16, then memory controller 18 generates a signal to retrieve the requested data from cache 16. Otherwise, memory controller 18 generates one or more signals to retrieve the requested data from main memory 14.

Figure 2A:
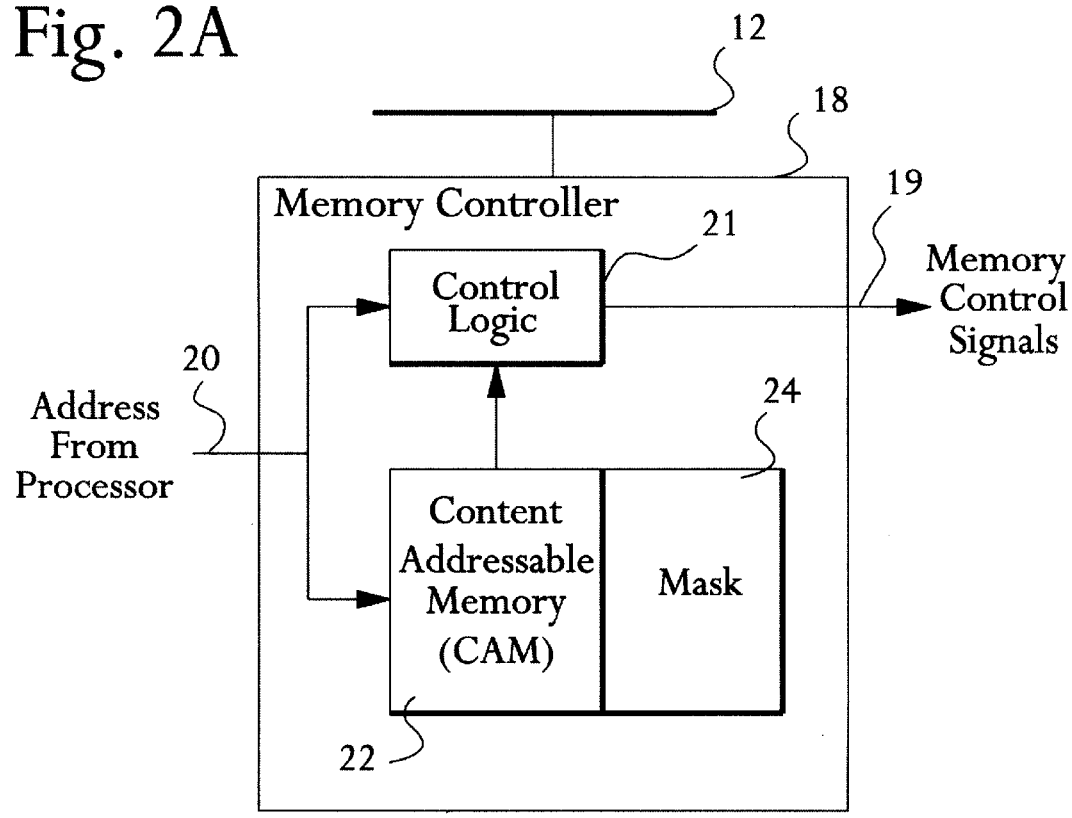
FIG. 2A and FIG. 2B are block diagrams illustrating two embodiments of a memory controller.
Figure 2B:
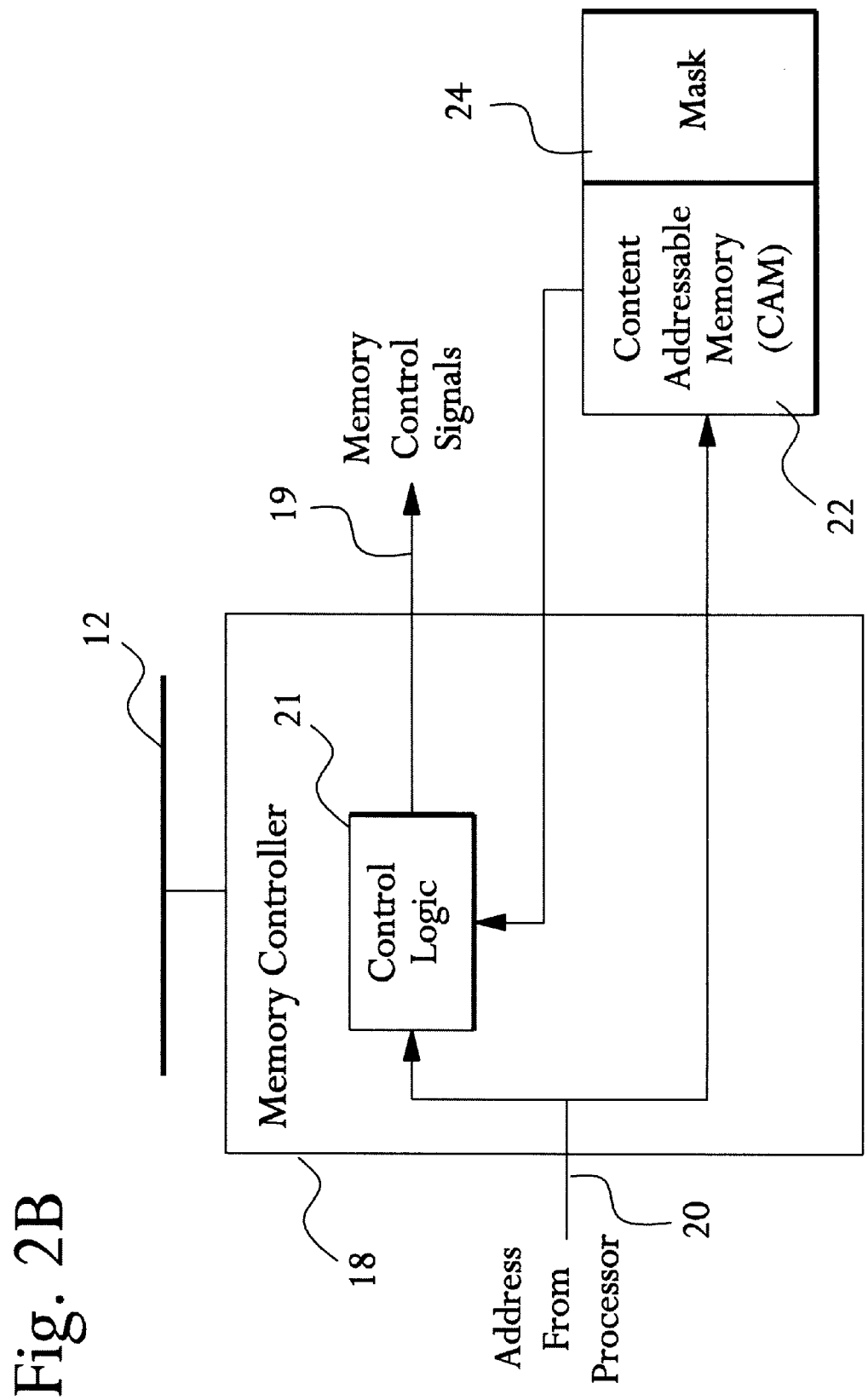

FIG. 2A and FIG. 2B are block diagrams illustrating two embodiments of memory controller 18 shown in FIG. 1. A control logic 21 and a content-addressable memory (CAM) 22 receive a data request from processor 10 on communication medium 20. The request from processor 10 indicates the memory address at which the requested data is stored. Control logic 21 and CAM 22 determine whether the requested data is stored in cache 16. Specifically, all addresses stored in CAM 22 are searched to determine whether the requested address is stored within CAM 22. A mask 24 is associated with CAM 22. Mask 24 is used in combination with CAM 22 to identify addresses stored within CAM 22. Although CAM 22 and mask 24 are shown in FIG. 2A adjacent to one another, in alternate embodiments of the invention CAM 22 and mask 24 may be separate components in different portions of a device or system as shown in FIG. 2B. Additional details regarding CAM 22 and mask 24 are provided below.

If the requested address is stored in CAM 22, then a signal is generated and provided to control logic 21 indicating a "match." This match signal indicates a likelihood that the requested data is stored in cache 16. However, as discussed below, the system may generate "false matches" in certain situations. If a match is identified, then control logic 21 must verify that the requested data is actually stored in cache 16. If the requested data is stored in cache 16, then control logic 21 generates an appropriate memory control signal to retrieve the requested data from cache 16. If the system does not generate a match or if a "false match" is identified, then control logic 21 generates a control signal to retrieve the requested data from main memory 14. Thus, the match signal generated by CAM 22 may be referred to as a preliminary match signal because additional verification is necessary to rule out false matches.

FIGS. 1, 2A, and 2B show a separate processor 10, memory controller 18, and cache 16 for purposes of illustration and explanation. However, in alternate embodiments of the invention, one or more of these components may be combined in a single component. For example, memory controller 18 (including CAM 22 and mask 24) may be contained within processor 10. In another embodiment, memory controller 18 and cache 16 may be included within processor 10.

Figure 3:
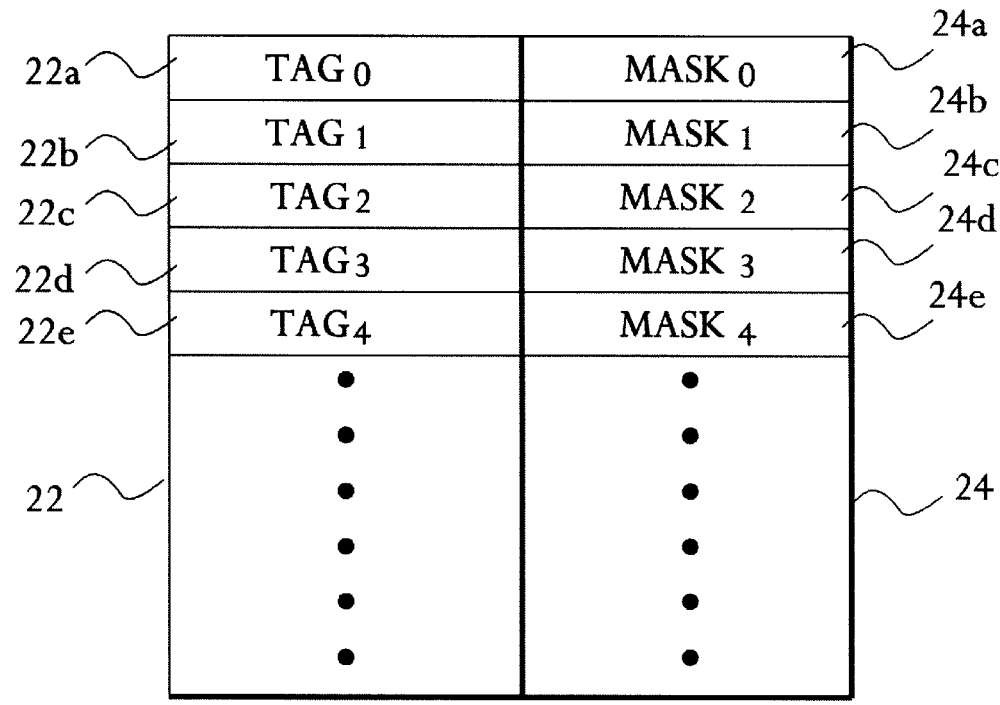
FIG. 3 illustrates an embodiment of a content-addressable memory and an associated mask.

FIG. 3 illustrates an exemplary CAM 22 and a mask 24, each having multiple rows for storing addresses and associated mask values. Typical memory devices such as DRAMs and SRAMs associate data with a particular address. In contrast, a content-addressable memory (CAM) associates an address with the data. The requested data (rather than the address) is provided to a CAM, which then searches its contents to identify a match (or hit). In the above example, CAM 22 is provided with data (in this case, the data is the requested address) at the CAM input. CAM 22 then searches all rows in the CAM for a match with the requested data (address). If a match is located, CAM 22 identifies the location of the requested data. CAM 22 shown in FIG. 3 contains various tags. In alternate embodiments, CAM 22 may contain an entire address rather than a tag.

Figure 4:
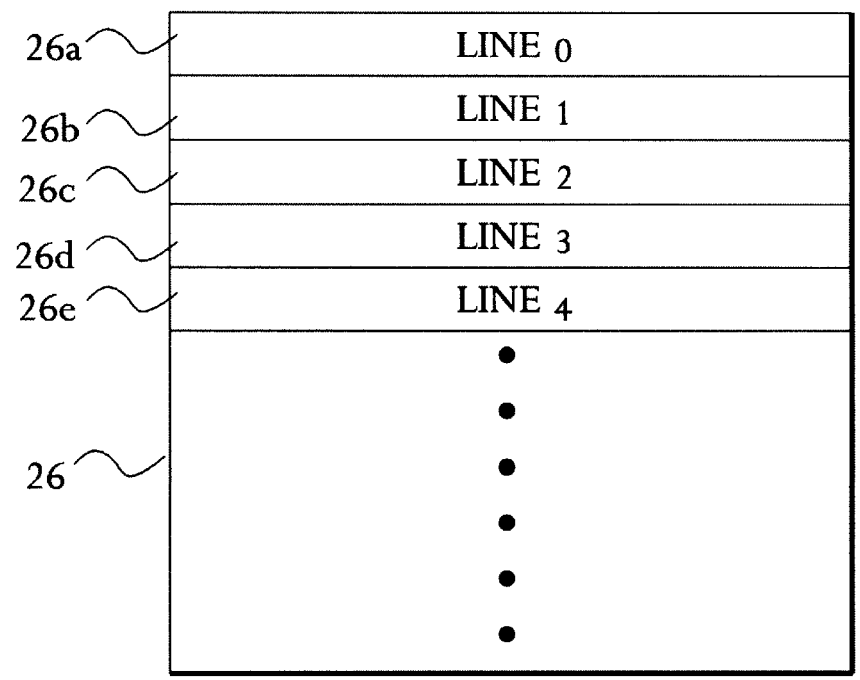
FIG. 4 illustrates an embodiment of a cache memory capable of implementing the teachings of the present invention.

As shown in FIG. 3, CAM 22 includes multiple rows (22a, 22b, 22c, etc.). Each row in CAM 22 may be associated with a particular cache line in cache 16. An embodiment of a cache 26 is shown in FIG. 4 and includes multiple cache lines 26a, 26b, 26c, etc. Thus, row 22a in CAM 22 is associated with cache line 26a in cache 26. Similarly, row 22b in CAM 22 is associated with cache line 26b. Alternatively, cache 26 may be a buffer having multiple buffer lines, where each row in CAM 22 is associated with one or more buffer lines.

As illustrated in FIG. 3, mask 24 is associated with CAM 22. Mask 24 may be constructed from SRAM cells, DRAM cells, or similar memory devices. It is not necessary that the mask values be stored in CAM 22. Each row in CAM 22 is associated with a particular entry in mask 24. For example, row 22a in CAM 22 is associated with mask entry 24a, and row 22b is associated with mask entry 24b. The association between each mask entry and each CAM row will be discussed in greater detail below.

Figure 5A:
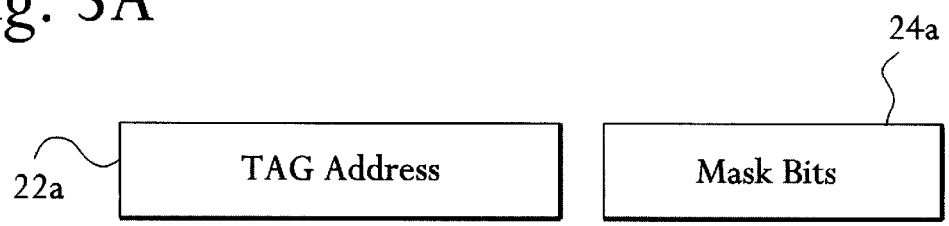
FIG. 5A illustrates an exemplary content-addressable memory row and associated mask bits.

FIG. 5A illustrates a particular CAM row 22a and an associated mask entry 24a. The tag address contained in CAM row 22a provides the address of the data stored in the associated cache line (in this example, cache line 26a). Mask entry 24a contains mask bits that correspond to the number of bits in the tag address. As discussed below, the mask bits are utilized to permit the identification of multiple addresses in one or more cache lines using a single tag address.

Figure 5B:
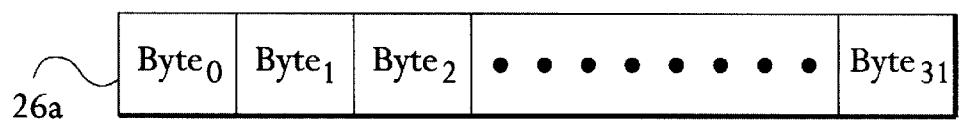
FIG. 5B illustrates an exemplary cache line capable of storing 32 bytes of data.

FIG. 5B illustrates an examplary cache line 26a capable of storing 32 bytes of data ($Byte_0$–$Byte_{31}$). Although a particular embodiment of the invention is illustrated using a cache capable of storing 32 bytes of data in each cache line, the invention may be used with caches or buffers having any number of bytes in each line.

Figure 6:
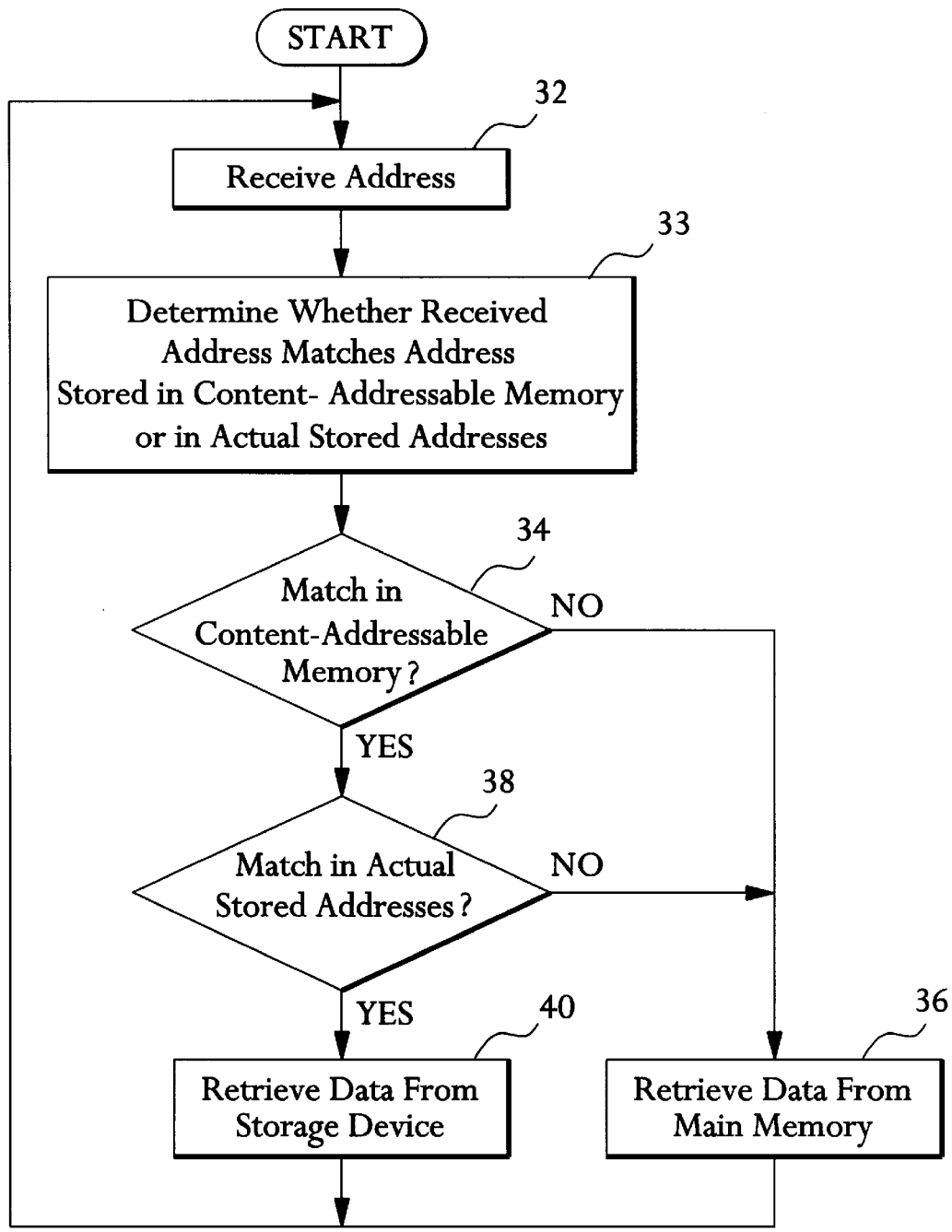
FIG. 6 is a flow diagram illustrating an embodiment of the overall procedure for retrieving data.

FIG. 6 is a flow diagram illustrating an embodiment of the overall procedure for retrieving data using the information stored in CAM 22 and mask 24. An address is received at step 32 that identifies data to be retrieved from main memory or a storage device such as a cache or a buffer. At step 33, the procedure begins two parallel operations: determining whether the received address matches any address stored in CAM 22 and determining whether the received address matches any actual stored address. Actual stored addresses are stored in a conventional memory independently of CAM 22 for use in determining whether an actual match exists in the storage device. Although steps 34 and 38 are illustrated as sequential steps, the determinations may be performed in parallel in step 33. The procedure is not required to wait for both determinations to be completed before continuing. For example, if a match is not identified in CAM 22 at step 34, then the procedure branches to step 36 to retrieve the requested data from main memory regardless of whether the received address matches any actual stored address. Similarly, if a match is not identified in the actual stored addresses at step 38, then the procedure branches to step 36 to retrieve the requested data from main memory regardless of whether the CAM matching determination has been completed.

If a match is detected at step 34, then the procedure must also consider whether the received address is actually stored in the storage device. This step is necessary due to the possibility of "false matches" generated when determining a match in CAM 22. Thus, CAM 22 (in combination with mask 24) is a fast mechanism to determine with a high degree of probability whether the requested data is stored in the storage device. The parallel determinations performed in step 33 increase the speed with which the data retrieval operation is performed.

If an actual match is detected at step 38 (in addition to a match identified in step 34), then the requested data is retrieved from the storage device (e.g., cache or buffer) at step 40. After retrieving the requested data from main memory in step 36 or the storage device in step 40, the procedure returns to step 32 to await receipt of the next address. Those of ordinary skill in the art will appreciate that multiple procedures for retrieving data may be performed in parallel or in fast succession.

FIG. 7 illustrates a flow diagram of an embodiment of a procedure used to generate and update the mask value associated with each CAM row. At step 42 of FIG. 7, all mask bits are set to zero. This step may be referred to as "generating" a mask for the associated CAM row. When the first data entry is received, the received data is stored in a particular storage element (e.g., cache line or buffer line) in the storage device at step 44. At step 46, a base address is set equal to the address of the first data entry stored in the storage element. The base address may be an entire data address or a tag address, and is stored in CAM 22. A separate base address may be associated with each storage element in a particular storage device. Once established, the base address remains constant regardless of the number of data entries added to the associated storage element. However the mask value is updated after storage of each additional data entry in the storage element.

When a single data entry is stored in the associated storage element, the mask value is zero. In this situation, the base address identifies the single data entry. But, when two or more data entries are stored in the same storage element, the mask value is changed to identify all addresses in the storage element using a single base address.

At step 48, it is determined whether new data has been received for storage in the storage device. If new data is received ("yes" at step 48), then the procedure branches to step 50 where the mask bits are set to one for each bit in the new address which differs from the base address. Initially, all mask bits are cleared to zero. Thus, any bits in the new address which differ from corresponding bits in the base address will cause the corresponding mask bit to change from zero to one. If a particular mask bit is already set to one, that mask bit is not changed in response to the new address. A particular mask bit may be set to one due to a previous addition of data to the storage element.

A formula for determining the new mask value in step 50 is illustrated as follows:

Mask=(Old Mask Value) OR ((Base Address) XOR (New Address))

The above formula first compares the Base Address and the New Address using an Exclusive-OR (XOR) logic function to identify differences in the bits of the two address values. A logic OR function is then performed on the Old Mask Value and the differences identified by the XOR function. Thus, a bit in the new Mask is set to one if a difference is identified or if the Old Mask Bit was set to one.

Referring again to FIG. 7, after the mask value has been updated at step 50 in response to the new address, the procedure returns to step 48 to determine whether additional data was received.

If new data is not received at step 48, the procedure continues to step 52 to determine whether the storage element contains a single entry and whether the mask value is non-zero. As discussed above, the mask value is zero when a single data entry is stored in an associated storage element. Thus, if a particular storage element contains two or more data entries, the mask value is changed to a non-zero value to identify all data entries. If data entries are subsequently removed from the storage element, the mask value may remain non-zero when only a single entry remains in the storage element. This situation is identified at step 52. If this occurs, step 54 clears the mask bits to zero and sets the base address to the address of the single data entry. The procedure then returns to step 48 to test for new data.

The procedure illustrated in FIG. 7 is performed for each storage element within a particular storage device. Thus, each base address and each mask value is associated with a particular storage element.

Figure 8A:
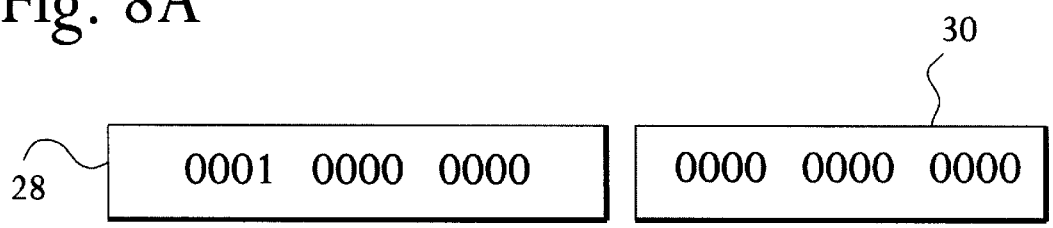
FIGS. 8A–8C illustrate exemplary base address values and mask values at different stages of the procedure illustrated in FIG. 6.
Figure 8B:
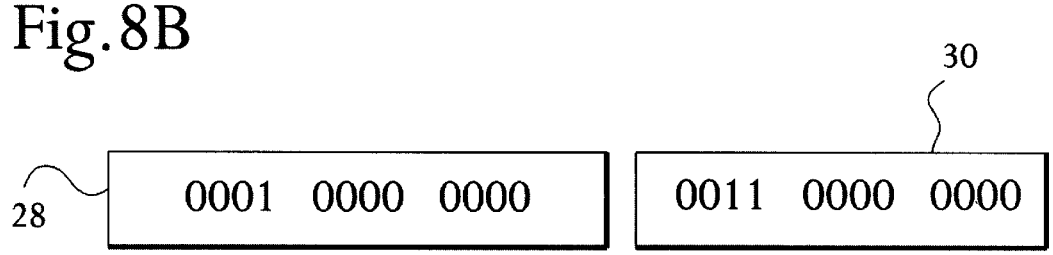
Figure 8C:
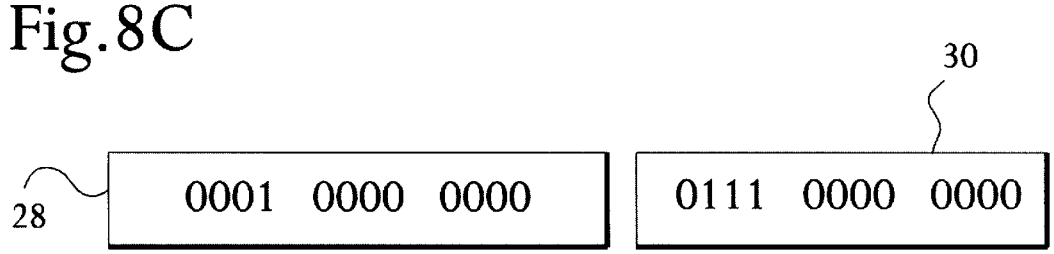

Referring to FIGS. 8A–8C, example values of a base address 28 and a mask value 30 are shown at different stages of the procedure described in FIG. 7. For this example, the storage device is a cache memory and each storage element contains one or more cache lines within the cache. FIG. 8A illustrates the status of base address 28 and mask 30 when the first data entry is stored in the cache line. In the example described, data from three different addresses will be stored in a single cache line. The three hexadecimal addresses are: 0×100, 0×200, and 0×400 (the address values have been simplified for purposes of explanation). The notation 0×100 is used to identify a hexadecimal number and is equivalent to the notation $100_{16}$. The first address (0×100) received is stored as base address 28, as shown in FIG. 8A. This base address is used for comparing all subsequent addresses. Note that the address 0×100 may be represented in binary notation as 0001 0000 0000, using four bits for each hexadecimal number in the address. The initial value for mask 30 is zero; i.e., all bits are cleared to zero.

FIG. 8B illustrates the status of base address 28 and mask 30 when a second data entry is received for storage in the same cache line. The address associated with the second data entry is 0×200. As discussed above, once established, base address 28 is not changed when additional data entries are stored in the associated cache line. However, mask 30 is changed to indicate the differences between the base address and the new address. As discussed above, the formula for calculating the new mask value is:

Mask=(Old Mask Value) OR ((Base Address) XOR (New Address))

Thus, the base address (0×100) is compared to the new address (0×200) as follows:

(0001 0000 0000) XOR (0010 0000 0000)=(0011 0000 0000)

Using the above formula, the new mask value is calculated:

Mask=(0000 0000 0000) OR (0011 0000 0000)=(0011 0000 0000)

In this example, the last two bits of the first hexadecimal number in the second address (0010) are different from the last two bits of the same number in the base address (0001). Therefore, these two bits in mask 30 are changed from zero to one as shown in FIG. 8B.

FIG. 8C illustrates the status of base address 28 and mask 30 when a third data entry is stored in the same cache line. In this example, the third data entry has an address 0×400. As described above, the base address remains constant while the new data entry is stored in the cache line. Mask 30 is updated again by changing the mask bits from zero to one for each bit in the new address which differs from the corresponding bit in base address 28. The base address (0×100) is compared to the new address (0×400) as follows:

(0001 0000 0000) XOR (0100 0000 0000)=(0101 0000 0000)

The new mask value is calculated:

Mask=(0011 0000 0000) OR (0101 0000 0000)=(0111 0000 0000)

The second bit of the first hexadecimal number in the third address (0100) is different from the corresponding base address bit shown in FIG. 8C. Therefore, the corresponding bit is changed in mask 30.

Note that the change in mask 30 in FIG. 8C incorporates the changes made previously in FIG. 8B. Thus, although the third bit of the first hexadecimal number of the third address is the same as the corresponding bit in the base address, the corresponding mask bit remains set at one as a result of the changes made in connection with the second address (FIG. 8B).

Figure 9:
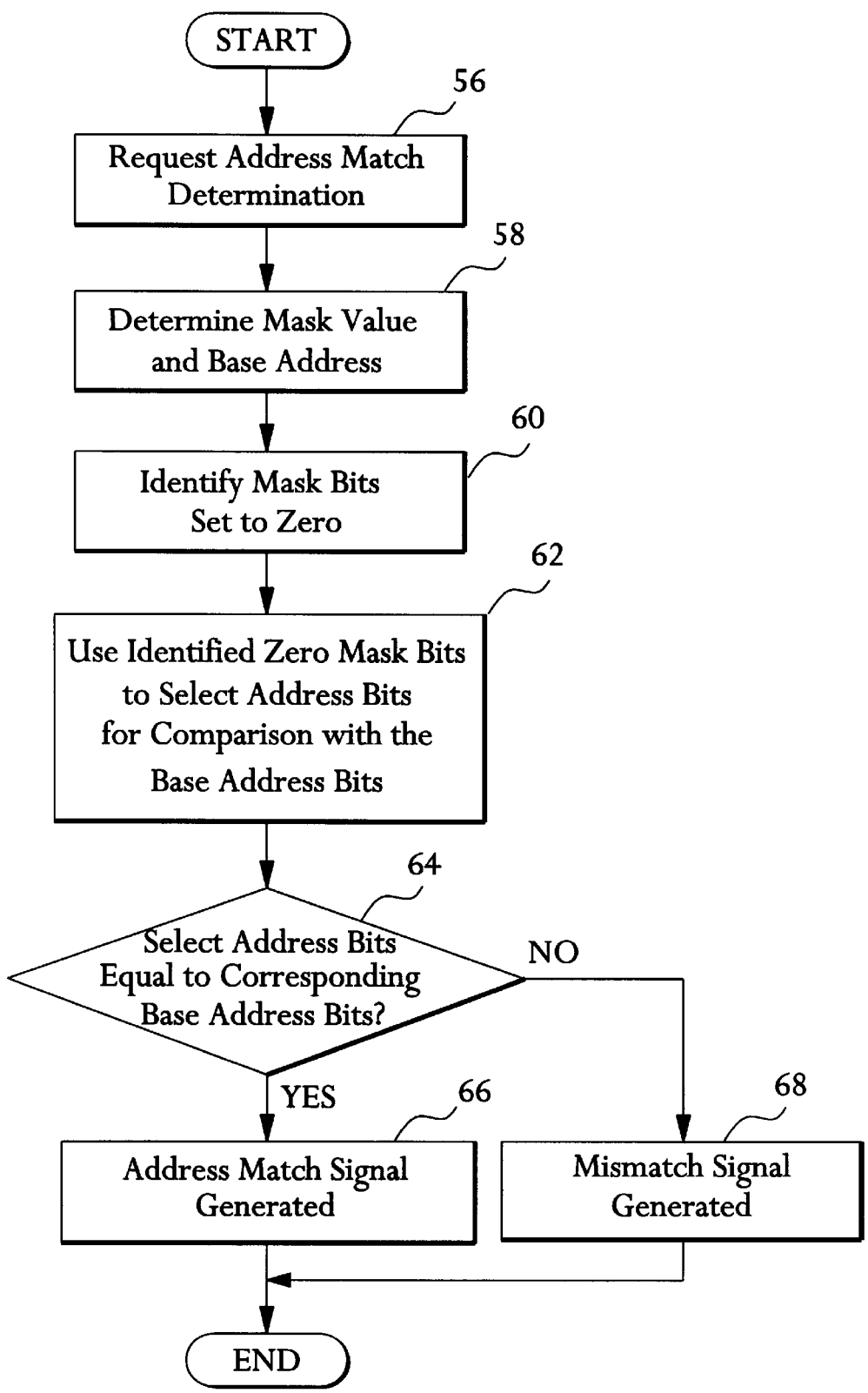
FIG. 9 is a flow diagram illustrating an embodiment of a procedure for determining whether a particular address is stored in the content-addressable memory.

FIG. 9 is a flow diagram illustrating an embodiment of a procedure for identifying a match with an address stored in CAM 22. Typically, a request for data is generated (e.g., by a processor, memory controller, or similar device) by indicating the address at which the data is stored. At step 56, a request is received to determine whether a particular address is stored in CAM 22, and therefore likely to be contained in the storage device associated with CAM 22.

At step 58, the procedure determines the mask value and the base address associated with each storage element in the storage device. At step 60, the procedure identifies all mask bits that are set to zero. The zero mask bits are used to select address bits for comparison with the corresponding base address bits in step 62. At step 64, the procedure determines whether the address bits selected for comparison in step 62 are equal to the corresponding base address bits. Steps 62 and 64 may be performed using the following equation:

IF ((requested address) XOR (base address)) AND (NOT mask)= 0,

THEN a match is indicated

The first portion of the equation, (requested address) XOR (base address), identifies differences or similarities between the two addresses. The second portion of the equation (NOT mask) causes the system to ignore address bits which correspond to mask bits set to one. Examples of the application of the above equation are provided below.

Referring again to FIG. 9, if the bits are equal at step 64 (i.e., the formula generated a match) then the procedure continues to step 66 where an address match signal is generated. This address match signal indicates a likelihood that the requested address is stored within the storage device. Otherwise, an address mismatch signal is generated, indicating that the requested address is not stored within the storage device.

An example of the procedure illustrated in FIG. 9 will be described with reference to base address 28 and mask 30 shown in FIG. 8C. As described above, FIG. 8C represents the base address and mask value after storing addresses 0×100, 0×200, and 0×400. If a requested address is 0×200, then the above equation provides:

(requested address) XOR (base address)=(0010 0000 0000) XOR (0001 0000 0000)=(0011 0000 0000)

NOT mask=(1000 1111 1111)

Thus, the complete equation is written as:

(0011 0000 0000) AND (1000 1111 1111)=(0000 0000 0000)

Since the equation produces a result of zero (all bits are zero), a match is indicated; i.e., the data corresponding to the requested address is likely to be stored in the cache memory. In this example, the match is correct because 0×200 was the second address added to the cache as described above.

In another example, the requested address is 0×800. In this situation, the equation provides:

(1000 0000 0000) XOR (0001 0000 0000)=(1001 0000 0000)

NOT mask=(1000 1111 1111)

(1001 0000 0000) AND (1000 1111 1111)=(1000 0000 0000)

Thus, the equation produces a non-zero result, indicating a failure to locate a match. This result is correct because the address 0x800 was not added to the cache, as described above. In this situation, the requested data must be retrieved from main memory.

The following example illustrates that a "false match" may occur in certain situations. If the requested address is 0x700, the equation provides:

(0111 0000 0000) XOR (0001 0000 0000)=(0110 0000 0000)

NOT mask=(1000 1111 1111)

(0110 0000 0000) AND (1000 1111 1111)=(0000 0000 0000)

Thus, the formula produces a zero result, indicating a likelihood that the data corresponding to the requested address is stored in the cache memory. However, address 0x700 was not added to the cache in the above example. Therefore, this result is a false match.

The above equation will identify a match that is correct; i.e., no "false mismatches" are generated. However, in certain situations, the equation will incorrectly identify an address match (false match). Thus, the invention accepts a certain number of false matches in exchange for a reduction in storage space necessary for storing multiple address tags in the CAM.

As additional bits are changed from one to zero in the mask, the probability of receiving false matches increases because only the mask bits having a zero value are used to compare the requested address with the base address. For example, if each bit in the mask is set to one, then every address will generate a match signal regardless of whether the address is actually stored in the CAM.

To minimize this problem, an embodiment of the invention provides a mechanism for tracking the number of mask bits that are set to one. This tracking mechanism may be any type of counter or other system capable of maintaining numerical data. If the number of set mask bits exceeds a particular threshold value, then no additional data is stored in the associated storage element. Instead, new data is stored in a different storage element within the storage device. Additionally, the tracking mechanism may check the number of mask bits that would be set if the new address is added to the storage element. If adding the new address would cause the threshold to be exceeded, then the tracking mechanism may cause the address to be added to a different portion of the storage device; e.g., in the next storage element.

In another embodiment of the invention, a procedure may be used to update the mask values if a significant number of bits are set to one. The updating is particularly useful when one or more data entries have been removed from the storage element without updating the mask values. Updating is performed by clearing all mask bits to zero and selecting one entry in the storage element as the base address. The mask values are adjusted for each remaining entry in the storage element using the procedures discussed above. This updating increases the accuracy of the match signal generated by the CAM.

In certain situations, a particular data entry may occupy two different storage elements. In this situation, the mask value for each storage element must be updated to include the address associated with the data entry.

As mentioned above, the present invention may be used with any type of storage device, including a cache or a buffer. Additionally, the CAM and mask may be located in a separate device (such as the memory controller shown in FIG. 2) or may be incorporated into the cache, buffer, or storage device itself. Alternate embodiments of the invention may be used with a buffer or queue in which a single base address or tag is associated with all entries in the buffer or queue. Thus, a "match" signal indicates a likelihood that the requested data is stored somewhere in the buffer or queue.

Another embodiment of the invention may utilize a valid bit associated with each CAM row. The valid bit indicates whether the mask value associated with a particular CAM row is valid; e.g., contains valid data. When using a valid bit, the mask value is not set to zero when the base address is stored in the CAM. When retrieving data, the valid bit indicates that the mask value is not zero and only the base address is tested for a match. When additional data is stored in the storage element, the valid bit is changed and the mask value is set according to the procedures described above.

In an alternate embodiment of the invention, multiple tag-mask pairs may be provided for each cache line or buffer line. For example, a system will be described having two tag-mask pairs for each cache line. When new data is received for storage, the system selects one of the two tag-mask pairs to receive the address of the new data. This selection is based on the number of mask bits already set in each mask, or by determining the number of bits that would be set if the mask is modified to include the new address. When a particular tag-mask pair has been selected, the mask is modified using the procedure described above with respect to FIG. 7. When searching for a particular address in the CAM, each tag-mask pair is searched using the procedures described above with reference to FIG. 9.

From the above description and drawings, it will be understood by those skilled in the art that the particular embodiments shown and described are for purposes of illustration only and are not intended to limit the scope of the invention. Those skilled in the art will recognize that the invention may be embodied in other specific forms without departing from its spirit or essential characteristics. References to details of particular embodiments are not intended to limit the scope of the claims.

What is claimed is:

1. A method for storing data comprising:
   receiving a first data entry and a first data address;
   storing the first data entry in a storage element of a storage device;
   storing the first data address as a base address in a first memory at a first location associated with the storage element;
   clearing a mask in a second memory at a second location associated with the storage element;
   receiving a second data entry and a second data address;
   storing the second data entry in the storage element of the storage device; and
   setting the mask in the second memory at the second location to indicate bits that are not equal in the base address and the second data address.

2. The method of claim 1 wherein setting the mask comprises:
   forming a first value equal to an exclusive-OR of the base address and the second data address;
   forming a second value equal to an OR of the mask and the first value; and
   setting the mask in the second memory at the second location equal to the second value to indicate bits that are not equal in the base address and the second data address.

3. The method of claim 1 further comprising:
   determining if the storage device is storing exactly one data entry in the storage element; and, if so, clearing the mask in the second memory at the second location, and storing a data address of the exactly one data entry as the base address in the first memory at the first location.

4. The method of claim 1 further comprising, prior to storing a third data entry having a third data address in the storage element of the storage device:

determining a number of set bits in the mask in the second memory at the second location;

if the number of set bits is less than a threshold number, then storing the third data entry in the storage element of the storage device;

setting the mask in the second memory at the second location to indicate bits that are not equal in the base address and the third data address.

5. The method of claim 1 further comprising, prior to storing a third data entry having a third data address in the storage element of the storage device:

determining a number of set bits that would result if the third data address were used to set bits in the mask in the second memory at the second location;

if the number of set bits that would result is less than a threshold number, then storing the third data entry in the storage element of the storage device;

setting the mask in the second memory at the second location to indicate bits that are not equal in the base address and the third data address.

6. The method of claim 1 further comprising:

determining a number of set bits in the mask in the second memory at the second location;

if the number of set bits is greater than a threshold number, then clearing the mask in the second memory at the second location;

storing a data address of a data entry stored in the storage element of the storage device as the base address in the first memory at the first location;

for each remaining data entry stored in the storage element of the storage device, setting the mask in the second memory at the second location to indicate bits that are not equal in the base address and the data address of each remaining data entry.

7. A method for retrieving data comprising:

receiving a data address;

comparing the data address to a base address stored at a first location in a first memory using a mask stored at a second location in a second memory, said second location being associated with the first location;

aborting retrieval of data stored in a storage element of a storage device if the unmasked portion of the data address does not equal the unmasked portion of the base address, said storage element being associated with the first location;

determining if the data address is equal to an actual address of the data stored in the storage element of the storage device; and retrieving data stored in the storage element of the storage device, if the data address is determined to be equal to the actual address.

8. The method of claim 7 further comprising:

retrieving data stored at the data address in a main memory if retrieval is aborted or if the data address is determined not to be equal to the actual address of the data stored in the storage element of the storage device.

9. An apparatus for storing data comprising:

a storage device having a number of storage elements;

a first memory having the number of base locations;

a second memory having the number of mask locations; and a control logic coupled to the storage device, the first memory, and the second memory;

where the control logic:

receives a first data entry and a first data address;

stores the first data entry in a storage element of the storage device;

stores the first data address as a base address in the first memory at a first location, said first location being associated with the storage element;

clears a mask in the second memory at a second location, said second location being associated with the storage element;

receives a second data entry and a second data address;

stores the second data entry in the storage element of the storage device; and sets the mask in the second memory at the second location to indicate bits that are not equal in the base address and the second data address.

10. The apparatus of claim 9 where, in setting the mask, the control logic:

forms a first value equal to an exclusive-OR of the base address and the second data address;

forms a second value equal to an OR of the mask and the first value; and sets the mask equal to the second value to indicate bits that are not equal in the base address and the second data address.

11. The apparatus of claim 9 where the control logic further:

determines if the storage device is storing exactly one data entry in the storage element; and, if so, clears the mask in the second memory at the second location, and stores a data address of the exactly one data entry as the base address in the first memory at the first location.

12. The apparatus of claim 9 where the control logic further:

determines a number of set bits in the mask in the second memory at the second location;

if the number of set bits is less than a threshold number, then the control logic stores a third data entry in the storage element of the storage device;

sets the mask in the second memory at the second location to indicate bits that are not equal in the base address and a third data address.

13. The apparatus of claim 9 where the control logic further:

determines a number of set bits that would result if a third data address were used to set bits in the mask in the second memory at the second location;

if the number of set bits that would result is less than a threshold number, then the control logic stores a third data entry in the storage element of the storage device;

sets the mask in the second memory at the second location to indicate bits that are not equal in the base address and the third data address.

14. The apparatus of claim 9 where the control logic further:

determines a number of set bits in the mask in the second memory at the second location;

if the number of set bits is greater than a threshold number, then the control logic clears the mask in the second memory at the second location;

stores a data address of a data entry stored in the storage element of the storage device as the base address in the first memory at the first location;

for each remaining data entry stored in the storage element of the storage device, sets the mask in the second memory at the second location to indicate bits that are not equal in the base address and the data address of each remaining data entry.

15. The apparatus of claim 9 wherein the storage device is a cache memory.

16. The apparatus of claim 9 wherein the storage device is a buffer.

17. The apparatus of claim 9 wherein the first memory is a content addressable memory.

18. An apparatus for retrieving data comprising:

a storage device having a number of storage elements;

a first memory having the number of base locations;

a second memory having the number of mask locations; and a control logic coupled to the storage device, the first memory, and the second memory;

where the control logic:

receives a data address;

compares the data address to a base address stored at a first location in the first memory using a mask stored at a second location in the second memory, said second location being associated with the first location;

aborts retrieval of data stored in a storage element of the storage device if the unmasked portion of the data address does not equal the unmasked portion of the base address, said storage element being associated with the first location;

determines if the data address is equal to an actual address of data stored in the storage element of the storage device; and retrieves data stored in the storage element of the storage device if the data address is determined to be equal to the actual address.

19. The apparatus of claim 18 where the control logic further:

retrieves data stored at the data address in a main memory if retrieval is aborted or if the data address is determined not to be equal to the actual address of the data stored in the storage element of the storage device.

20. The apparatus of claim 18 where the control logic further:

uses the mask stored at the second location in the second memory to compare the data address to the base address stored at the first location in the first memory only if a valid bit for the second location indicates that the mask is valid.

* * * * *